United States Patent [19]

Frye, Jr.

[11] Patent Number: 5,295,782
[45] Date of Patent: Mar. 22, 1994

[54] TAB MAGAZINE LOADER AND METHOD USING A SLIDER MECHANISM

[75] Inventor: Ronald E. Frye, Jr., Newman, Calif.

[73] Assignee: VLSI Technology, Inc., San Jose, Calif.

[21] Appl. No.: 751,500

[22] Filed: Aug. 29, 1991

[51] Int. Cl.⁵ .............................................. B65G 57/30
[52] U.S. Cl. ................................... 414/795.3; 53/541
[58] Field of Search ............. 414/794.9, 795.2, 795.3; 53/242, 541, 475

[56] References Cited

U.S. PATENT DOCUMENTS

| | | | |
|---|---|---|---|
| 2,361,960 | 11/1944 | Pelosi | 414/795.3 X |
| 2,735,164 | 2/1956 | Boyd et al. | 414/794.9 X |
| 4,068,767 | 1/1978 | Tippetts | 414/794.9 X |
| 4,766,714 | 8/1988 | Sugaya | 53/242 |
| 5,142,844 | 9/1992 | Frye, Jr. | 414/795.3 X |

FOREIGN PATENT DOCUMENTS

| | | | |
|---|---|---|---|
| 2229254 | 3/1974 | Fed. Rep. of Germany . | |
| 3116293 | 4/1982 | Fed. Rep. of Germany | 53/541 |
| 3230704 | 11/1985 | Fed. Rep. of Germany . | |
| 245778 | 5/1987 | Fed. Rep. of Germany | 414/794.9 |
| 133818 | 5/1989 | Japan | 414/795.3 |
| 1458149 | 2/1989 | U.S.S.R. | 414/795.2 |
| 1500590 | 8/1989 | U.S.S.R. | 414/794.8 |

Primary Examiner—D. Glenn Dayoan
Assistant Examiner—Boris Milef
Attorney, Agent, or Firm—Patrick T. King

[57] ABSTRACT

A TAB carrier is loaded into the bottom position of a bottom-loading stacking magazine using a slider which conveys the TAB carrier from a first loading position to a second unloading position located beneath the stacking magazine. The slider has a first horizontal surface on which a TAB carrier is initially placed and a second horizontal surface which is elevated above the first horizontal surface. A ramp surface connects the two horizontal surfaces. A retractable knife blade engages the TAB carrier and permits the TAB carrier to be carried by the slider only from the first position to the second position and prevents the TAB carrier from being carried by the slider from the second position back to the first position. A specific embodiment of the knife blade includes a front surface configured as an inclined cam surface which is engaged and pushed vertically downward by the TAB carrier as the TAB carrier is moved horizontally by the slider from the first position to the second position and a rear vertically-oriented surface which engages the TAB carrier and prevents horizontal movement of the TAB carrier as the slider is returned from the second position to the first position.

3 Claims, 3 Drawing Sheets

TAB MAGAZINE LOADER AND METHOD USING A SLIDER MECHANISM

BACKGROUND OF THE INVENTION

1. Field of the Invention.

This invention relates to apparatus and methods for handling tape-automated-bonded (TAB) integrated circuits and more particularly for loading TAB carriers into a bottom-loading stacking magazine.

2. Prior Art.

An inexpensive technique for packaging and automated handling of integrated circuit dies, or chips, is to bond an integrated-circuit die to a section of 35 or 70 mm. polyimide tape material. Each section of tape has a conductor pattern formed on it. This packaging technique is called tape-automated bonding (TAB). For testing and handling, each section of tape has its peripheral edges connected to a TAB carrier, which is a thin frame attached to the peripheral edges of a segment of tape.

For storage and handling, the TAB carriers are loaded into stacking magazines, in which the TAB carriers are held in vertical stacks. Because the it is intended that the TAB carriers be handled by automated handling devices, there is a need for apparatus and methods for bottom-loading the stacking magazines to facilitate the use of automated handlers or robotic equipment.

SUMMARY OF THE INVENTION

It is therefore an object of the invention to provide apparatus and methods for loading TAB carriers into stacking magazines.

In accordance with this and other objects of the invention, apparatus is provided for loading a TAB carrier into the bottom position of a bottom-loading stacking magazine. A slider moves along the horizontal surface of a base and conveys the TAB carrier from a first loading position to a second unloading position located beneath the stacking magazine. The slider includes a first horizontal surface on which a TAB carrier is initially placed and a second horizontal surface which is elevated above the first horizontal surface. A ramp surface extends between the first horizontal surface and the second horizontal surface.

A retractable cam device, or "knife blade," engages the TAB carrier and permits the TAB carrier to be carried by the slider only from the first position to the second position and prevents the TAB carrier from being carried by the slider from the second position back to the first position. When the TAB carrier is engaged by a pair of retractable knife blades as the slider is moved from the second position to the first position so that the TAB carrier is pushed up the ramp surface from the first horizontal surface of the slider to the second horizontal surface of the slider as the slider moves from the second position to the first position and the TAB carrier is pushed up into a stack of one or more previously loaded TAB carriers in the stacking magazine.

A specific embodiment of the retractable cam, or knife blade, includes a front surface configured as an inclined cam surface which is engaged by and which is and pushed vertically downward by the leading edge of and the bottom surface of the TAB carrier as the TAB carrier is moved horizontally by the slider from the first position to the second position. The retractable cam device includes a rear vertically-oriented surface which engages the trailing edge of the TAB carrier and prevents horizontal movement of the TAB carrier as the slider is returned from the second position to the first position.

The method of the invention includes loading a TAB carrier onto a first horizontal surface of a slider and moving the slider along the horizontal surface of a base from a first loading position to a second position located beneath a stacking magazine. The method includes the step of engaging a cam device with a TAB carrier as the TAB carrier is moved from the first position to the second position. The cam device is pushed to a retracted position as the TAB carrier passes over it. The slider is then moved back to the first position, while the trailing edge of the TAB carrier engages a vertical surface of the cam device so that the TAB carrier slides along the slider from the first horizontal surface of the slider to a second horizontal surface of the slider, leaving the TAB carrier in position at the bottom of the stack in the magazine.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiment of the invention, an example of which is illustrated in the accompanying drawings. While the invention will be described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

Figure 1:
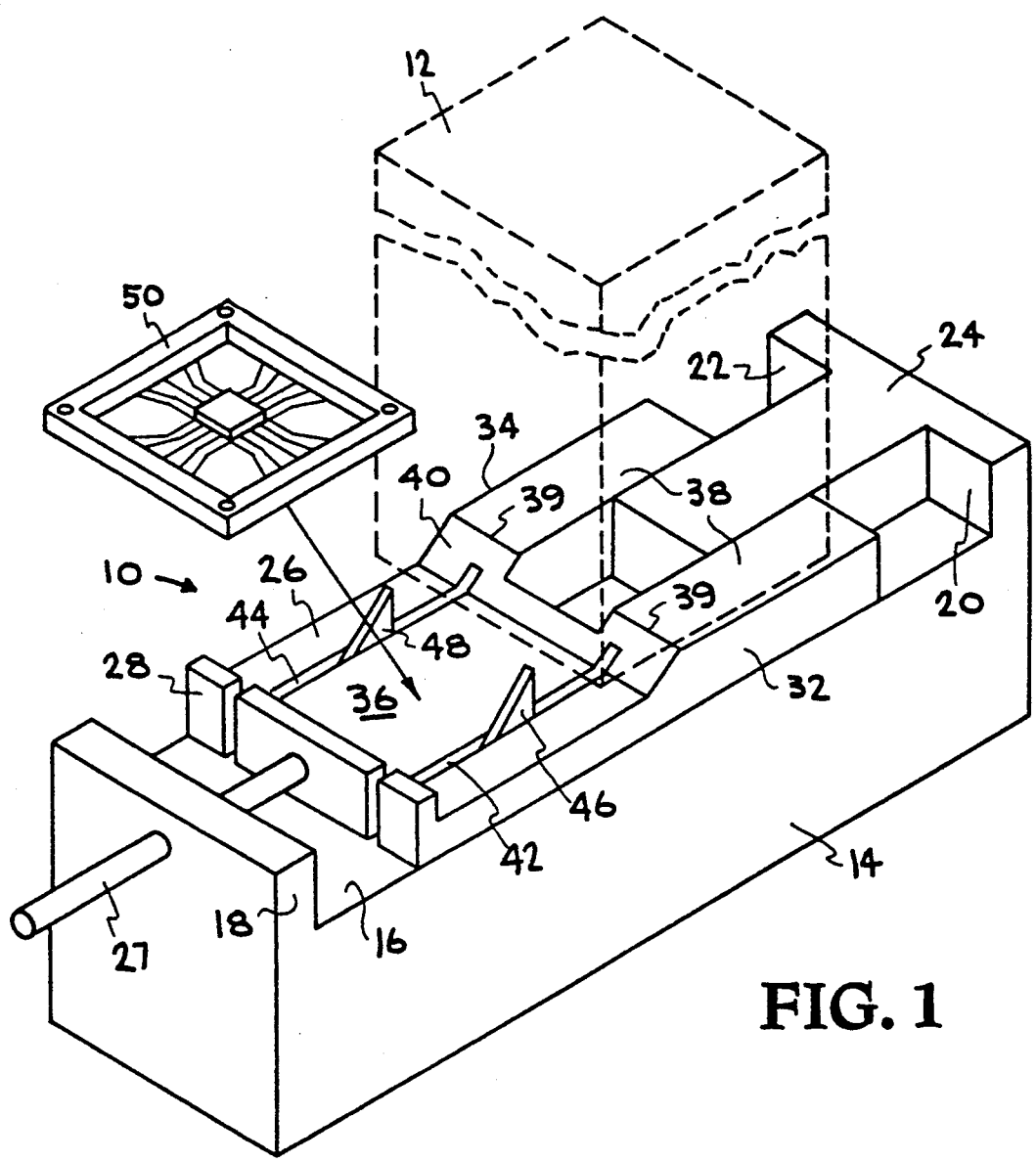
FIG. 1 is a perspective view of a stacking magazine and of apparatus, including a slider mechanism moveable on the horizontal surface of a base, for loading a TAB carrier into the bottom-most position in a vertically stacking TAB-carrier magazine.

FIG. 1 shows a loader assembly 10 for vertically stacking TAB carriers in a stacking magazine 12 (shown in dotted outline). The stacking magazine 12 is a box formed of molded plastic material and has a square cross section with an open top and open bottom. TAB carriers are vertically loaded into the magazine 12 through the open bottom thereof.

The loader assembly 10 includes a base 14 having an elongated horizontal top surface 16. At one end of the surface 16 is a stop block 18, which extends upwardly from the base 14. At the opposite end of the base 14 are two stop blocks 20, 22, which together with a raised guide-block 24, extend upwardly from the base 14.

An elongated slider member 26 moves horizontally along the surface 16 of the base 14. The slider 26 is moved, for example, by a control rod 27 which is moved by conventional apparatus including mechanical, electrical, pneumatic, hydraulic apparatus, or a combination thereof. One end 28 of the slider 26 engages the stop block 18. The respective ends of two arms 32, 34 extending from the slider 26 engage the stops blocks 20, 22. The raised guide-block 24 engages the inside walls of the arms 32, 34, as shown in the drawing, to guide the movement of the slider 26 along the surface of the base 14.

The slider 26 has a first horizontal surface 36, which is located adjacent the one end 28 of the slider 26. A TAB carrier is initially loaded onto this first horizontal surface 36 by a handler device which handles TAB carriers while the TAB carriers are tested, sorted, and assigned to be loaded into predetermined stacking magazines. The slider 26 has a second horizontal surface 38, which is provided as the top surfaces of the arms 32, 34. The second horizontal surface 38 is elevated above the first horizontal surface 36. A ramp surface 40 connects the first horizontal surface 36 and the second horizontal surface 38. The ramp surface and the second horizontal surface intersect along a line 39.

A pair of slots 42, 44 are formed through the slider 26 near the first horizontal surface 36. Each of these slots 42, 44 provides clearance for respective spring-loaded, retractable cam members, or knife blades 46, 48. As the slider is mover from a first position adjacent the stop 18 to a second position adjacent the stops 20, 22, the knife blades are engaged and depressed below the surface 36 by a TAB carrier resting on the surface 36 of the slider 26. When the slider reaches the second position adjacent the stops 20, 22, the knife blades 46, 48 extend above the surface 36 to engage the edge of a TAB carrier and prevent the TAB carrier from being carrier by the slider 26 back to the loading position near the stop 18.

Figure 2:
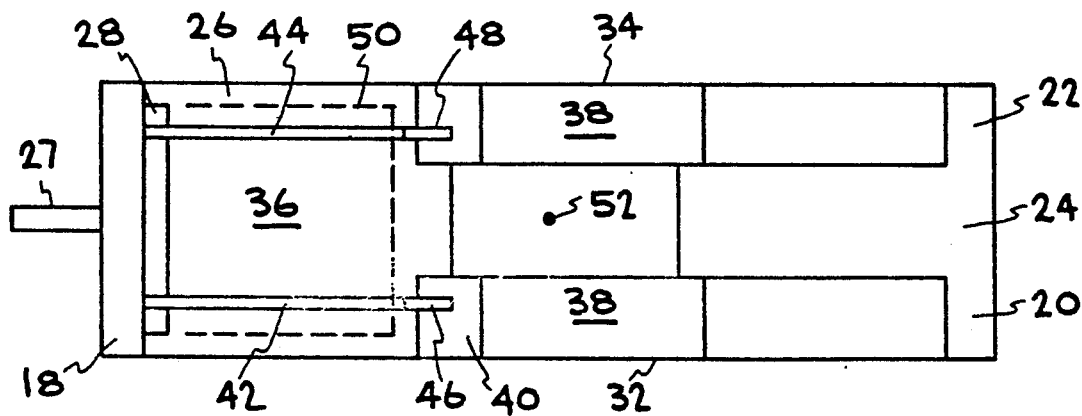
FIG. 2 is a plan view of the slider mechanism and base of FIG. 1.

FIG. 2 is a plan view of the slider mechanism 10 of FIG. 1. This view shows a TAB carrier 50 (shown in dotted outline) positioned on the first horizontal surface 36 of the slider 26. A stacking magazine 12 is to be centered over the point indicated by the dot 52 near the center of the base 14, as shown in the figure.

Figure 3:
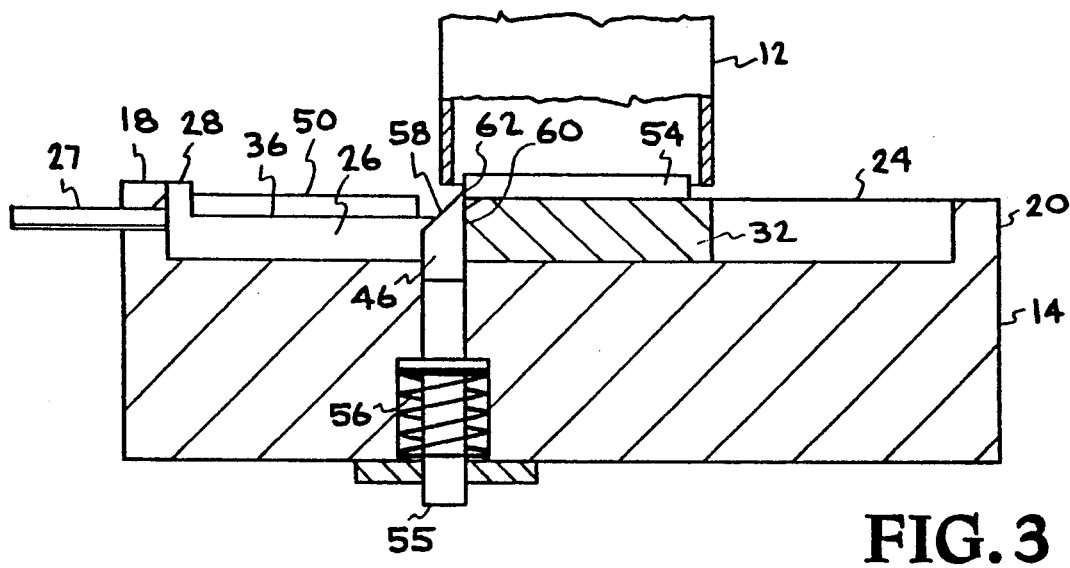
FIG. 3 is a sectional view showing a TAB carrier initially loaded into a slider mechanism, where the slider mechanism is shown in an initial loading position and where a blade for retaining TAB carriers already loaded into the stacking magazine is shown in an extended position.

FIG. 3 is a sectional view showing a TAB carrier 50 initially loaded onto the first horizontal surface 36 of a slider 26. Another previously loaded TAB carrier 54 is shown located in the bottom position of the magazine. The knife blade, or retractable cam, 46 is shown in its uppermost position. The knife blade 46 is fixed at the end of a plunger 55 which is slideably mounted in the base 14 and upwardly biased by a spring 56.

The sloped front surface 58 of the blade 46 is sloped upwardly from left to right so that a TAB carrier engages the sloped surface 58 and pushes the blade 46 downwardly. As the TAB carrier 50 is moved horizontally away from a position near the stop 18, the leading edge of the TAB carrier engages the sloped front surface 58 and pushes the blade 46 downwardly. The rear surface 60 of the blade 46 is vertically oriented to engage the trailing edge of a TAB carrier after the slider 26 has been moved to a position adjacent the stops 20, 22 on the base 14. The front sloping surface 58 and the rear surface 60 of the blade 46 meet at a tip 62.

Figure 4:
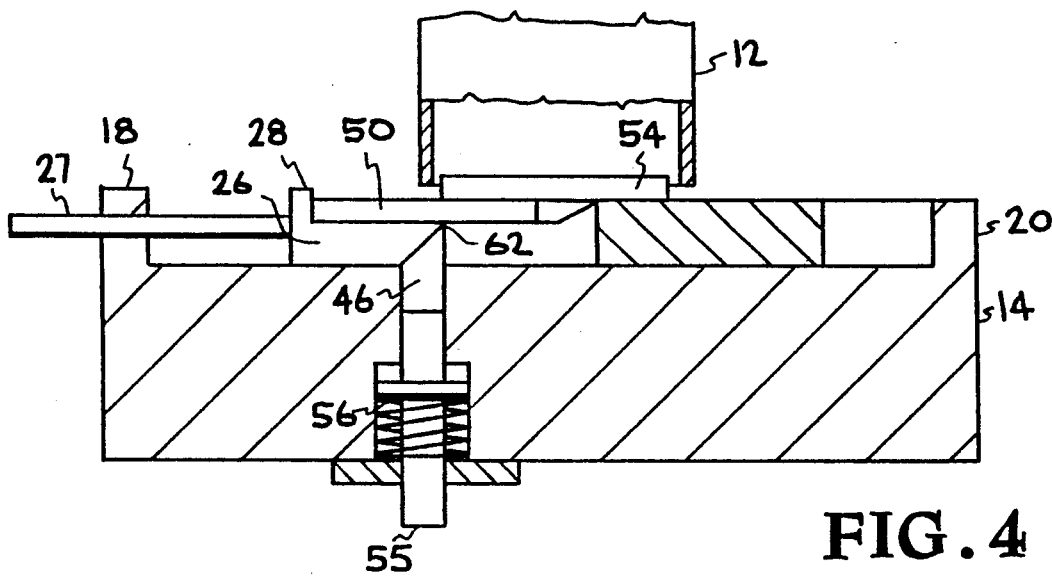
FIG. 4 is a sectional view showing the slider mechanism moved toward the stacking magazine, where the retainer blade for is shown in a retracted position.

FIG. 4 is a sectional view showing the slider 26 moved closer toward the stacking magazine 12. As the leading edge of the TAB carrier 50 passes the tip 62 of the blade 46, the leading edge of the TAB carrier engages the sloping front surfaces of the blades 46, 48 and pushes the blades 46, 48 downwardly. FIG. 4 shows the tip 62 of the blade 46 engaged by the bottom surface of the TAB carrier as the slider 26 is moved towards toward the stops 20, 22 on the base 14.

Figure 5:
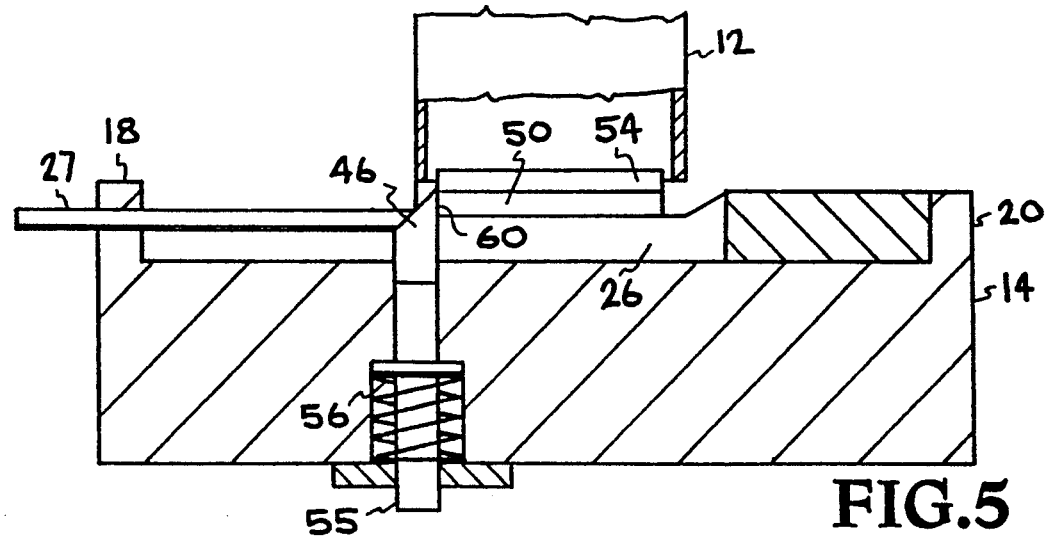
FIG. 5 is a sectional view showing the slider mechanism located to position a new TAB carrier beneath the stacking magazine, where the retainer blade is extended to retain both the previously loaded TAB carriers.

FIG. 5 is a sectional view showing the slider 26 located against the stops 20, 22 on the base 14. At this location the TAB carrier is positioned directly beneath the stacking magazine 12. The blades 46,48 are biased upwardly so that they extend above the trailing edge of the TAB carrier 50, as indicated in the figure. The vertical rear edge 60 of the blade retractable blade 46 engages the trailing edge of the TAB carrier 50, serving as a stop to prevent the TAB carrier from moving leftwardly while the slider 26 is moved to the left.

Figure 6:
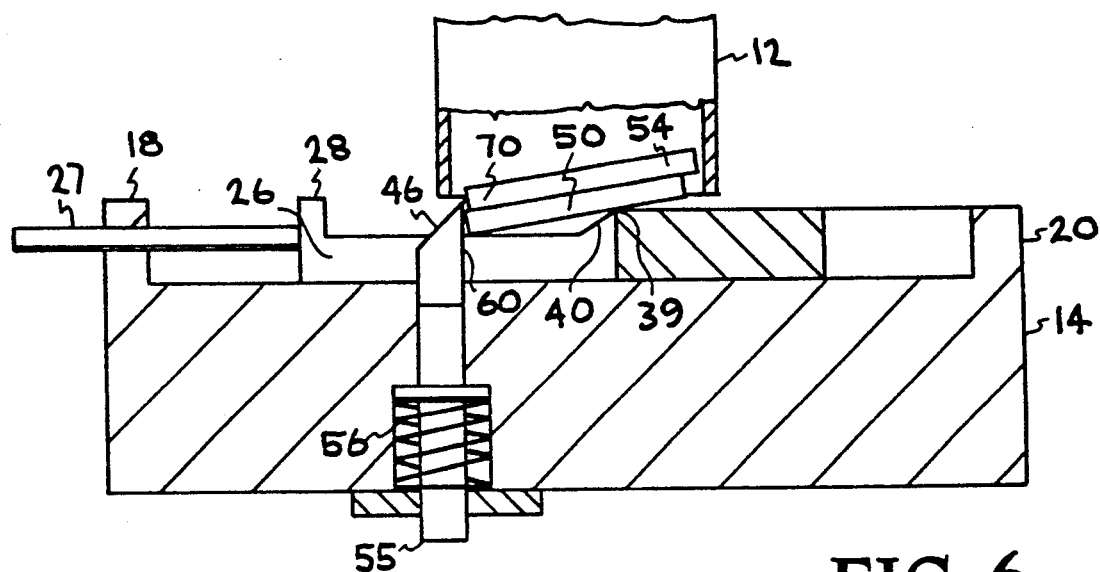
FIG. 6 is a sectional view showing the slider mechanism located in a position where the TAB carrier is being removed from the slider by the retainer blade and retained in position beneath the stacking magazine.

FIG. 6 is a sectional view showing the slider 26 as it is moved away from the stacking magazine 12 toward the stop 18 on the base 14. As the slider 26 is moved to the left, the TAB carrier 50 is held in a position below the magazine 12 by the blades 46,48. The movement of the slider 26 to the left causes the leading edge of the TAB carrier to ride up the ramp surface 40 and to pivot about the intersection line 39, as indicated in the drawing. Note that FIG. 6 shows that a TAB carrier 70, which has been previously stored in the TAB carrier riding on the TAB carrier 50 as the TAB carrier 50 is being inserted into the lowermost position in a stack of TAB carrier in the magazine 12.

Figure 7:
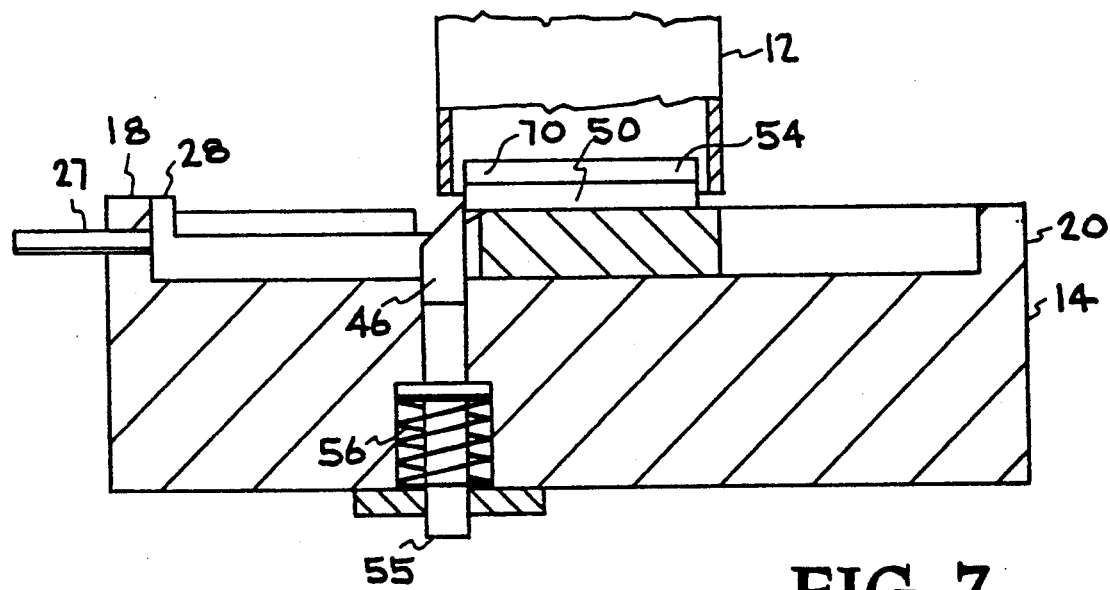
FIG. 7 is a sectional view showing the previously-loaded TAB carrier described with reference to the previous Figures being located in the stack beneath the stacking magazine and where another new TAB carrier has been loaded into the slider mechanism.

FIG. 7 is a sectional view showing the TAB carrier 50 still located beneath the stacking magazine 12 as the slider 26 is moved all the way back to a position near the stop 18. The TAB carrier 50 is prevented from moving away from the bottom of the stack by the blades 46,48. As the slider 26 is pulled toward the left of the stack and the intersection line 39 passes the center of the stack, the TAB carrier 50 assumes a horizontal position on the second horizontal surface 38 of the slider 26.

The stacking magazine 12 has an open top and bottom. After the magazine 12 is loaded with a stack of TAB carriers, a plug cap is inserted into the top of the magazine a lid is slid into positioned on the bottom end of the magazine.

The foregoing description of a specific embodiment of the present invention has been presented for purposes of illustration and description. It is not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. Apparatus for loading a TAB carrier into the bottom position of a bottom-loading stacking magazine, comprising:

a base having a horizontal surface;

a one-piece slider member, moveable on the horizontal surface of the base, for conveying the TAB carrier from a first loading position to a second unloading position located below the stacking magazine; said one-piece slider member including a first horizontal surface on which a TAB carrier is initially placed, a second horizontal surface which is elevated above the first horizontal surface, and a ramp surface extending between and connecting the first horizontal surface and the second horizontal surface;

retractable cam means, mounted on said base and positioned beneath the bottom-loading stacking magazine to engage said TAB carrier, for permitting the TAB carrier to be carried by the one-piece slider member only from the first loading position to the second unloading position and for preventing the TAB carrier from being carried by the slider member from the second position back to the first position;

said retractable cam means having a front surface configured as an inclined cam surface which is engaged and pushed vertically downward by the TAB carrier as the TAB carrier is moved horizontally by the one-piece slider member from the first loading position to the second unloading position; and said retractable cam means having a rear vertically-oriented surface which engages the TAB carrier and prevents horizontal movement of the TAB carrier as the slider member is returned from the second unloading position back to the first position;

wherein the leading edge of the TAB carrier first engages with the retractable cam means as the slider member is moved from the second position to the first position; wherein the bottom surface of the TAB carrier holds the retractable cam means in a retracted position as the slider member moves toward the second unloading position; wherein the TAB carrier is pushed up the ramp surface from the first horizontal surface of the slider to the second horizontal surface of the slider member as the slider member moves from the second position back to the first position and as the retractable cam means moves from the retracted position to engage the trailing edge of the TAB carrier when the TAB carrier is in the second unloading position to prevent the TAB carrier from moving from the second unloading position; and wherein the TAB carrier is pushed up into a stack of one or more previously loaded TAB carriers in the stacking magazine as the TAB carrier is pushed up the ramp surface of the slider member from the first horizontal surface to the second horizontal surface.

2. The apparatus of claim 1 wherein the retractable cam means is spring-loaded.

3. A method of loading a TAB carrier into a bottom-loading stacking magazine, comprising the steps of:

loading a TAB carrier onto a first horizontal surface of a slider member, which is located in a first loading position;

moving the slider, having the TAB carrier on the first horizontal surface of the slider member along the horizontal surface of a base toward a second unloading position located beneath the stacking magazine;

engaging a cam surface of a retractable cam device with the leading edge and the bottom surface of the TAB carrier as the TAB carrier is moved from the first loading position toward the second unloading position and forcing the cam device to a retracted position as the TAB carrier passes over it;

positioning the slider member in the second unloading position and releasing the retractable cam device to an extended position;

moving the slider from the second unloading position back to the first position; and engaging a stop surface of the cam device in its extended position with the trailing edge of the TAB carrier as the slider member is returned from the second unloading position to the first loading position; wherein the cam device causes the TAB carrier to slide along the slider member from the first horizontal surface of the slider member along a ramp surface, which extends between and which connects the first horizontal surface and a second horizontal surface on the slider member, to the second horizontal surface of the slider with the TAB carrier pushed into the stacking magazine as the TAB carrier slides along the ramp surface to the second horizontal surface on the slider member.

* * * * *